(12) United States Patent
Linder et al.

(10) Patent No.: US 6,931,083 B1
(45) Date of Patent: Aug. 16, 2005

(54) LOW NOISE, LOW DISTORTION, MUXABLE GILBERT MIXER SIGNAL PROCESSING SYSTEM AND METHOD WITH AGC FUNCTIONALITY

(75) Inventors: Lloyd F. Linder, Agoura Hills, CA (US); Clifford N. Duong, Fountain Valley, CA (US); Don C. Devendorf, Carlsbad, CA (US)

(73) Assignee: TelASIC Communications, Inc., El Segundo, CA (US)

( * ) Notice: Subject to any disclaimer, the term of this patent is extended or adjusted under 35 U.S.C. 154(b) by 0 days.

(21) Appl. No.: 09/579,596

(22) Filed: May 26, 2000

(51) Int. Cl.[7] .............................................. H04L 27/08
(52) U.S. Cl. ...................................................... 375/345
(58) Field of Search ............................... 375/316, 219, 375/345, 298, 340, 130, 341; 455/73, 291, 455/553.1, 321; 327/113

(56) References Cited

U.S. PATENT DOCUMENTS

| | | | |
|---|---|---|---|
| 5,630,228 A | | 5/1997 | Mittel |
| 5,636,251 A | * | 6/1997 | Citta et al. .................. 375/341 |
| 5,805,988 A | | 9/1998 | Clayton et al. |
| 5,999,804 A | | 12/1999 | Forgues |
| 6,031,878 A | * | 2/2000 | Tomasz et al. ............. 375/316 |
| 6,125,135 A | * | 9/2000 | Woo et al. .................. 375/130 |
| 6,397,044 B1 | * | 5/2002 | Nash et al. .................... 455/73 |
| 6,483,355 B1 | * | 11/2002 | Lee et al. .................... 327/113 |

FOREIGN PATENT DOCUMENTS

| | | |
|---|---|---|
| EP | 501827 A2 | 9/1992 |
| EP | 853374 A1 | 7/1998 |
| EP | 951138 A1 | 10/1999 |
| TW | 086118990 | 12/1997 |
| WO | WO 99/63676 | 12/1999 |

* cited by examiner

Primary Examiner—Stephen Chin
Assistant Examiner—Curtis Odom
(74) Attorney, Agent, or Firm—Morrison & Foerster LLP (57) ABSTRACT

A signal processing system and method. The inventive system includes a first circuit for distributing an input signal between two or more channels in a current mode of operation. A second circuit is disposed in each of the channels for processing the input signal and providing an output signal in response thereto. A third circuit is provided to combine the signals output by the processing circuit. A fourth circuit is included for controlling the first and the third circuits. In a specific illustrative embodiment, the system further includes a radio frequency stage for downconverting a received signal and providing the input signal in response thereto. In the specific embodiment, the first circuit includes a mixing circuit. The mixing circuit includes Gilbert cells and circuitry for providing automatic gain control for each of the channels individually. The Gilbert cells and the automatic gain control circuitry are driven by a transconductance amplifier and therefore operate in a current mode. Differential digital automatic gain control signals are provided in response to a channel select signal from a digital control circuit. The inventive circuit provides multiple IF channels which may be filtered individually. The invention thereby provides wide band operation in a simple, single stage implementation that consumes little power. Further, the current mode thereof is effective in the reduction of insertion loss.

10 Claims, 6 Drawing Sheets

LOW NOISE, LOW DISTORTION, MUXABLE GILBERT MIXER SIGNAL PROCESSING SYSTEM AND METHOD WITH AGC FUNCTIONALITY

This invention was made with Government support under Contract No. F30602-97-C-0223 awarded by the Air Force. The Government has certain rights in this invention.

BACKGROUND OF THE INVENTION

1. Field of the Invention

The present invention relates to electronic circuits and systems. More specifically, the present invention relates to radio frequency receivers and transceivers used in communication applications.

2. Description of the Related Art

For future military and commercial applications there may be a need for a radio capable of operating over a wide band of frequencies. This would ordinarily involve switching or multiplexing the received signal to one of N channels for subsequent gain control and mixing operations. However, it would be difficult for a single radio frequency (RF) switch to cover either the RF or IF frequency range.

Accordingly, a more promising approach would be to use a number of RF switches to selectively direct a received RF signal to an appropriate intermediate frequency processing stage. These switches would typically be single pole, multi-throw solid state switches implemented in silicon or Gallium Arsenide (GaAs). The switches would typically be disposed on a separate chip relative to the RF receiver in a 50-ohm environment.

Unfortunately, in addition to requiring complicated circuitry, this approach would present difficult power, third order intercept (intermodulation product distortion), noise figure, insertion loss and interchannel isolation issues. In addition, the switches would have to operate over a wide RF band or a wide IF band, both of which are difficult to achieve.

Hence, there is a developing need in the art for a system or method for providing a radio capable of operating over a wide band with minimal power consumption and circuit complexity. More specifically, there is a growing need in the art for a system or method for switching or multiplexing a received signal to one of N channels for subsequent gain control and mixing operations for individual and simultaneous output via a single stage at low power.

SUMMARY OF THE INVENTION

The need in the art is addressed by the signal processing system and method of the present invention. The inventive system includes a first circuit for distributing an input signal between two or more channels in a current mode of operation. A second circuit is disposed in each of the channels for processing the input signal and providing an output signal in response thereto. A third circuit is provided to combine the signals output by the processing circuit. A fourth circuit is included for controlling the first and the third circuits.

In a specific illustrative embodiment, the system further includes a radio frequency stage for downconverting a received signal and providing the input signal in response thereto. In the specific embodiment, the first circuit includes a mixing circuit. The mixing circuit includes Gilbert cells and circuitry for providing automatic gain control for each of the channels individually. The Gilbert cells and the automatic gain control circuitry are driven by a transconductance amplifier and therefore operate in a current mode. Differential digital automatic gain control signals are provided in response to a channel select signal from a digital control circuit. The inventive circuit provides multiple IF channels which may be filtered individually. The invention thereby provides wide band operation in a simple low power single stage while the current mode thereof is effective in the reduction of insertion loss.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
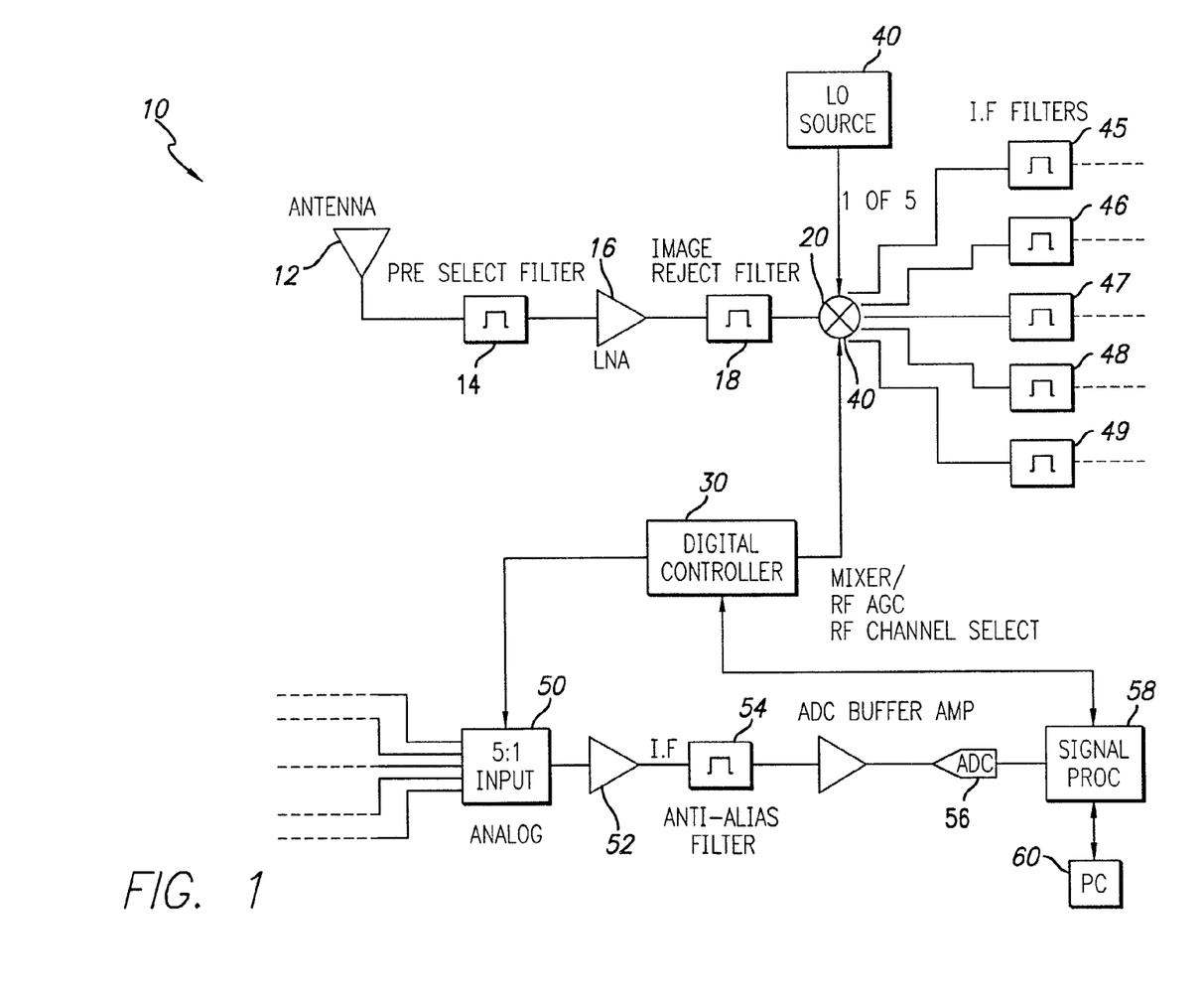
FIG. 1 is a block diagram of an illustrative implementation of a receiver incorporating the signal processing system of the present invention.

FIG. 1 is a block diagram of an illustrative implementation of a receiver incorporating the signal processing system of the present invention. The system 10 includes an RF front end comprising an antenna 12, a conventional preselect filter 14, a low noise amplifier (LNA) 16 and an image rejection filter 18. The preselect filter 14 narrows the receive band down to the band of interest. Signals in the band of interest are amplified by the LNA 16 and images therein are rejected by the image rejection 0filter 18.

In accordance with the present teachings, the output of the image rejection filter 18 is applied to a mixing circuit 20 designed in accordance with the present teachings. The mixer 20 is controlled by a digital controller 30. The digital controller 30 may be implemented with software in a microprocessor, a serial controller, a field programmable gate array, application specific integrated circuit or suitable discrete logic. Those skilled in the art will appreciate that the present teachings are not limited to the use of a digital AGC circuit nor are the present teachings limited to a digital controller. Other suitable analog equivalents may be used for this purpose depending on the requirements of a given application.

The controller 30 provides mixer, RF automatic gain control (AGC), and RF channel select signals to the mixer 20.

Figures 2, 3:
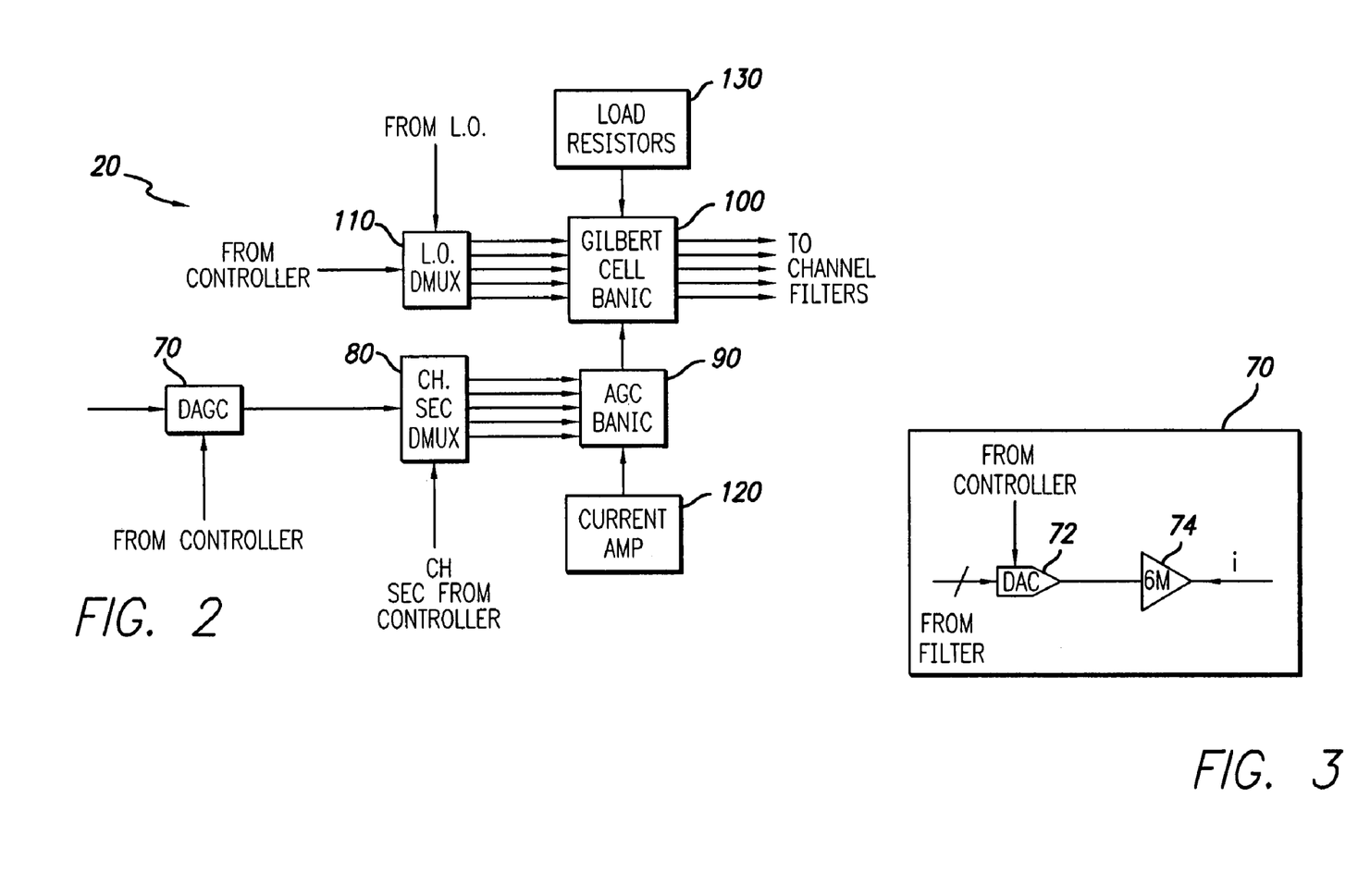
FIG. 2 is a block diagram showing an illustrative implementation of the mixing circuit of FIG. 1 in accordance with the present teachings.
FIG. 3 is a diagram showing an illustrative implementation of the digital automatic gain control circuit in more detail.

FIG. 2 is a block diagram showing an illustrative implementation of the mixing circuit of FIG. 1 in accordance with the present teachings. As shown in FIG. 2, the mixing circuit 20 includes a digital automatic gain control circuit (DAGC) 70, which provides global gain control of the signal output by the filter 18.

FIG. 3 is a diagram showing an illustrative implementation of the digital automatic gain control circuit in more detail. The DAGC 70 may be implemented with a digital-to-analog converter (DAC) 72 and a transconductance (voltage to current) amplifier 74. The DAGC 70 outputs a gain controlled current control signal to a channel select multiplexer 80.

Figure 4:
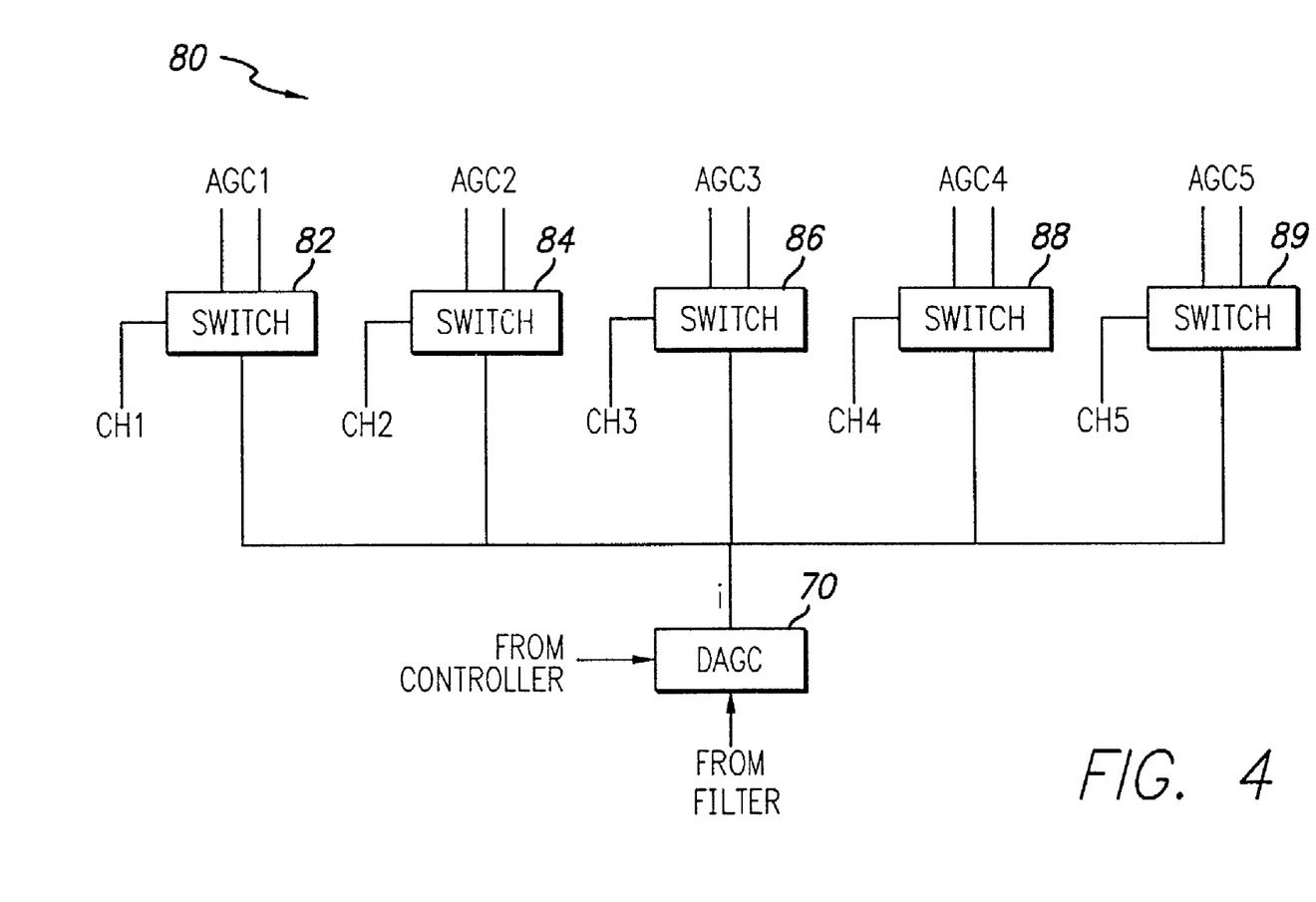
FIG. 4 is a diagram showing an illustrative implementation of the channel select multiplexer.

FIG. 4 is a diagram showing an illustrative implementation of the channel select multiplexer. The channel select multiplexer 80 may be implemented with a plurality of switches 82, 84, 86, 88 and 89 each of which receive the output of the DAGC 80 and output a differential automatic gain control current control signal in response to an associated channel select signal supplied by the controller 30 of FIG. 1.

Returning to FIG. 2, the differential outputs of the channel select multiplexer 80 are applied to a respective automatic gain control (AGC) circuit in a bank of AGCs 90 in the mixing circuit 20. The AGCs 90 control the current therethrough in response to the control signal received thereby from the DAGC 70 via the channel select multiplexer 80. All but one of the AGCs in the bank of AGCs 90 are connected to an associated Gilbert cell in a bank of Gilbert cells 100. The cells 100 receive a local oscillator signal from a local oscillator source 40 (FIG. 1) via a local oscillator multiplexer 110. Current for the Gilbert cells 100 is supplied by a second transconductance amplifier 120 and adjusted by the AGCs 90 in proportion to the signal supplied by the DAGC 70.

Figure 5:
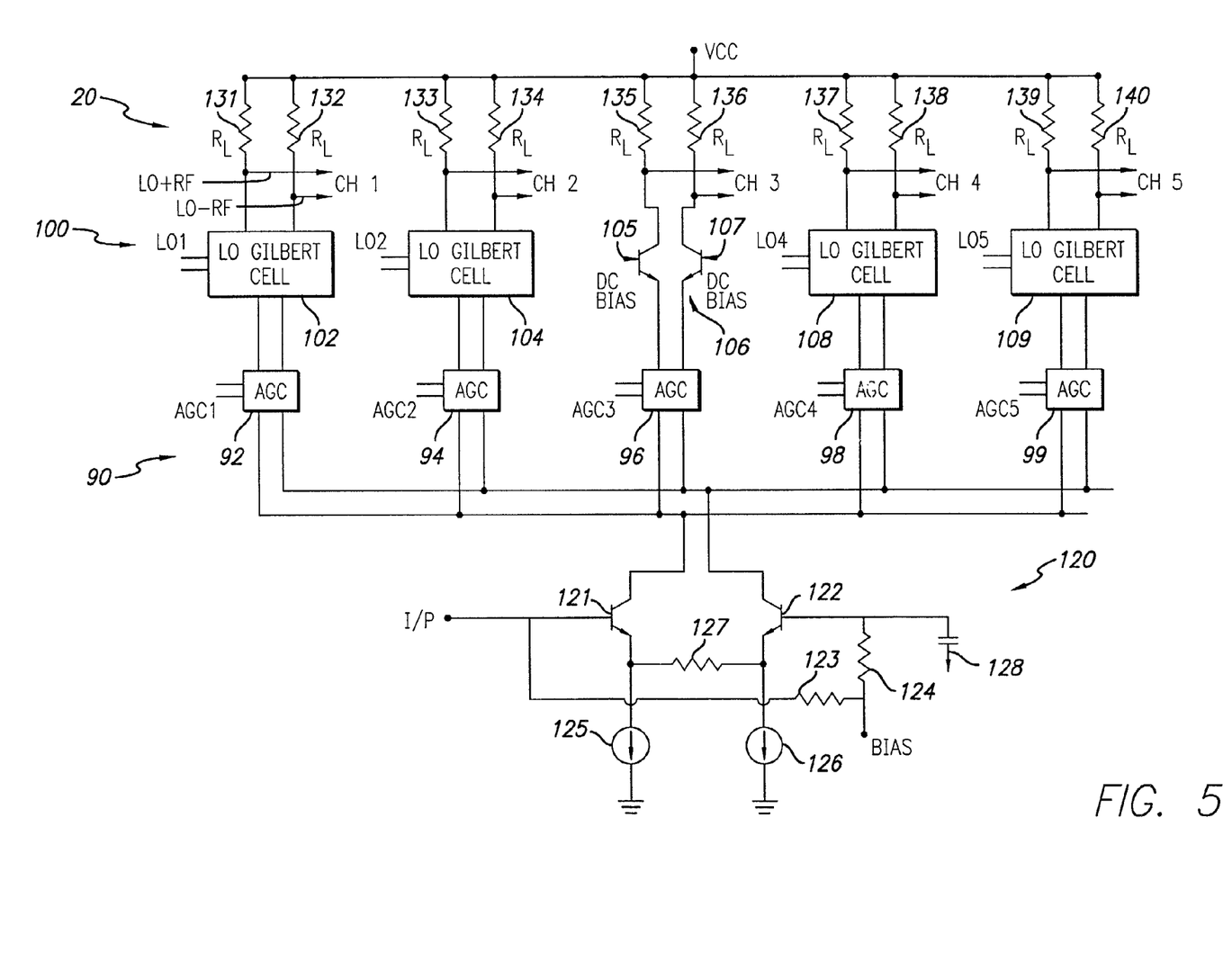
FIG. 5 is a diagram showing automatic gain control circuits, Gilbert cells, transconductance amplifier and load resistors of the mixer of FIG. 1 in more detail.

FIG. 5 is a diagram showing automatic gain control circuits, Gilbert cells, transconductance amplifier and load resistors of the mixer of FIG. 1 in more detail. The system 10 is implemented with five channels. Those skilled in the art will appreciate that the present teachings are not limited to the number of channels employed. In theory, the number of IF sections that can be added will depend on the effects of the parasitic capacitance at the MUX/AGC stage at the RF stage output, and the effect on the bandwidth of the local oscillator driver. A long as adding more stages does not band limit the local oscillator severely or band limit the RF signal path (or degrade the intercept performance there), then more stages can be added until such events occur.

Each channel pushes differential current through the second transconductance amplifier 120 and includes an AGC 92, 94, 96, 98 or 99.

In the illustrative embodiment, the transconductance amplifier 120 is implemented with first and second bipolar (NPN) transistors 121 and 122 connected in an emitter degenerated differential pair configuration. The collector of each transistor 121 and 122 provides one of the two differential inputs to each of the AGCs 90. The base terminals of the first transistor 121 and the second transistor 122 in the amplifier 120 are supplied by a bias supply via first and second resistors 123 and 124, respectively. The emitter terminals of the first transistor 121 and the second transistor 122 in the amplifier 120 are connected to ground via first and second current sources 125 and 126, respectively. In addition, the emitter terminals of the first transistor 121 and the second transistor 122 are connected via a resistor 127. In addition, the base terminal of the second transistor 122 is filtered by a capacitor 128 connected to ground.

As mentioned above, the gain of the current through each of the AGCs 90 is set by the gain control signal supplied by the controller 30 via the DAGC 70. Each AGC is selected via the multiplexer 80 by a channel select signal supplied by the controller 30 as described above.

Figure 6:
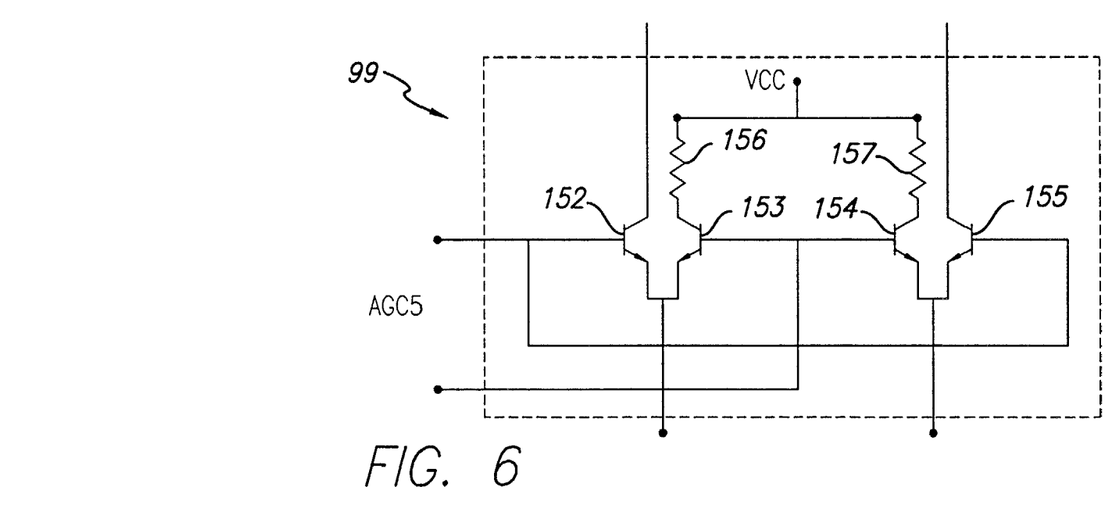
FIG. 6 is a schematic diagram of an illustrative implementation of an automatic gain control circuit of FIG. 5.

FIG. 6 is a schematic diagram of an illustrative implementation of an automatic gain control circuit of FIG. 5. The gain control circuits may be implemented in accordance with the teachings of U.S. Pat. No. 6,040,731 issued Mar. 21, 2000, to Chen et al. and entitled Differential Pair Gain Control Stage, the teachings of which are incorporated herein by reference. In the illustrative implementation, each AGC (e.g. 99) includes, for each input, a first bipolar (NPN) transistor 152 and a second transistor 153 (or 154 and 155) connected in a differential pair configuration to receive an AGC control signal (e.g., AGC5) from the DAGC 70 as mentioned above. The emitter terminals of each transistor pair are connected to one of the differential inputs from the transconductance amplifier 120. One transistor in each pair 153 and 154 is connected to a source of supply voltage ($V_{cc}$) via a bias resistor 156 or 157, respectively. The collector terminals of the second transistor in each pair 152 and 155 provide the differential outputs of the AGC.

Channels 1, 2, 4 and 5 include a Gilbert cell 102, 104, 108 and 109 respectively. Gilbert cells are well known in the art. See for example U.S. Pat. No. 3,689,752 issued Sep. 5, 1972 to Barrie Gilbert and entitled Four Quadrant Multiplier Circuit, the teachings of which are incorporated herein by reference.

Figure 7:
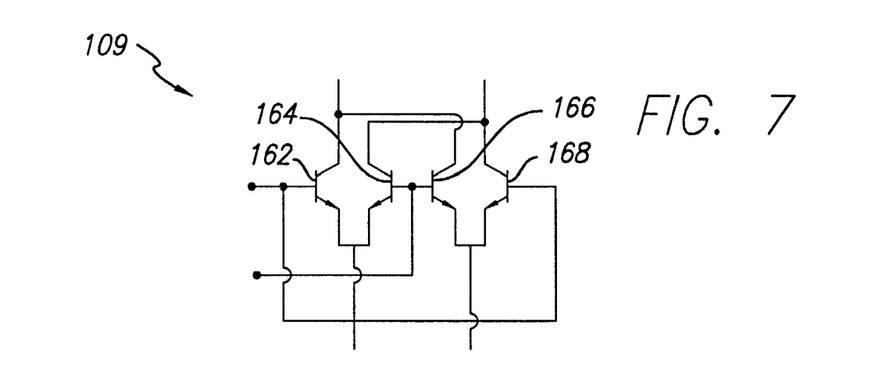
FIG. 7 is a schematic diagram of an illustrative implementation of a Gilbert cell of FIG. 5.

FIG. 7 is a schematic diagram of an illustrative implementation of a Gilbert cell of FIG. 5. Each cell (e.g., 109) includes a pair of transistors 162/164 and 166/168 for each differential input connected in a Differential pair configuration. Each base terminal of each transistor in each pair is connected to and LO in FIG. 5, which is generated in the LO MUX 110 in FIG. 2, which creates the multiple LO signals in FIG. 8.

The emitter terminals of the two transistors in each pair are connected to one of the differential inputs from an associated AGC. The collector terminal of each transistor in each pair is tied to a collector terminal of the other pair and provides one of the differential outputs of the cell.

As mentioned above, the cells 100 receive a local oscillator signal from a local oscillator source 40 (FIG. 1) via a local oscillator multiplexer 110.

Figure 8:
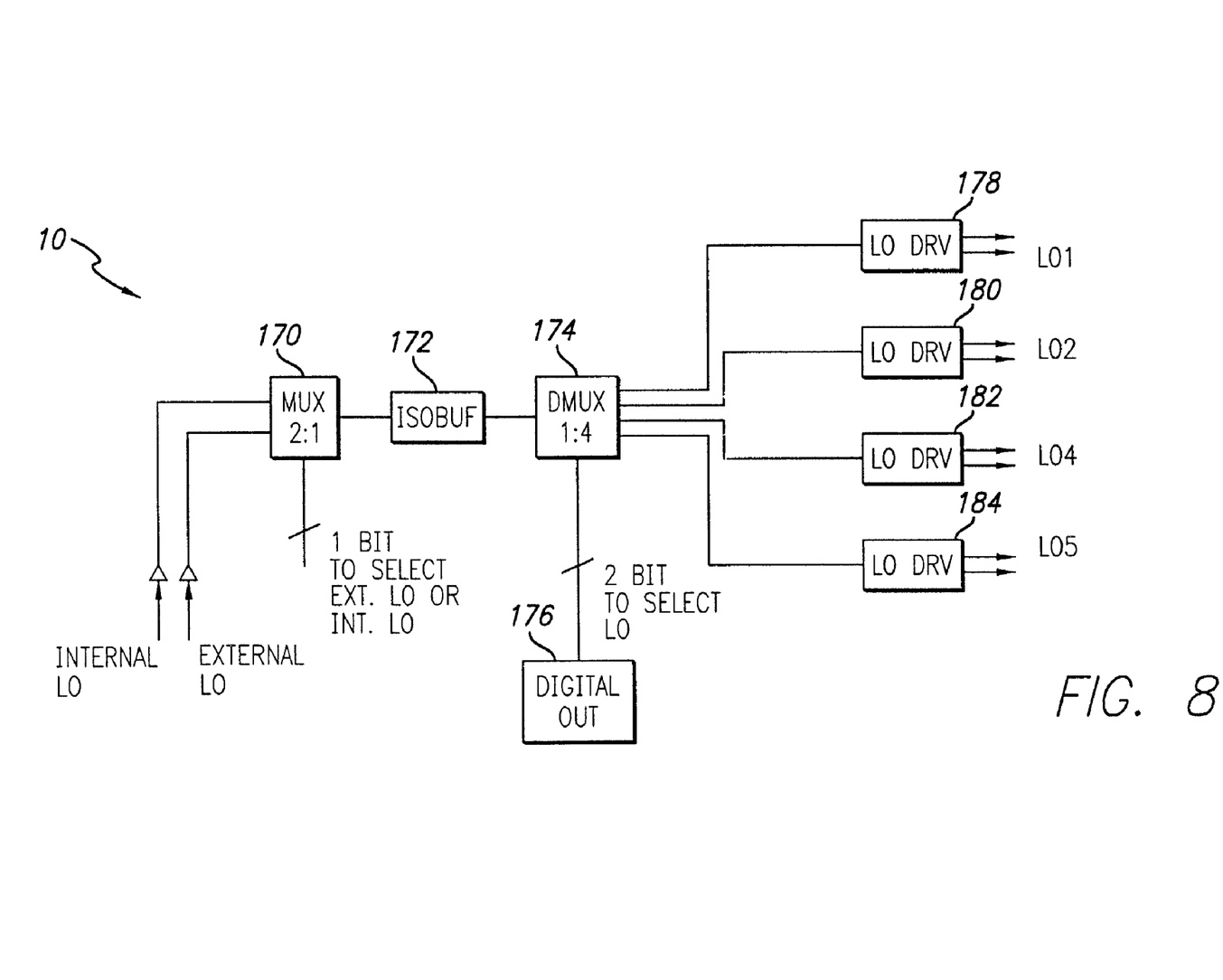
FIG. 8 is a block diagram of an illustrative implementation of the local oscillator multiplexer.

FIG. 8 is a block diagram of an illustrative implementation of the local oscillator multiplexer. The local oscillator multiplexer 110 includes a 2:1 multiplexer 170 which receives internal local oscillator (LO) and external LO inputs from the local oscillator source 40 of FIG. 1 and a 1 bit select input from the digital controller 30. The LO source 40 can be either generated internally on the chip in a phase lock loop (PLL) (defined as INTERNAL LO), or externally off the chip (EXTERNAL LO). The output of the multiplexer 170 is provided to a 1:4 demultiplexer 174 via an isolation and squaring circuit 172. A digital circuit 176 provides two bit LO select control for the 1:4 demultiplexer 174. Digital circuit 176 is a two-bit decode, and can be part of the control circuit 30. I did not receive FIG. 9 in the packet. The DMUX 174 is in FIG. 8, and it is a conventional design. Two digital bits select one of the four paths (the fifth path is a by-pass mode).

The demultiplexer 174 provides input to each of four local oscillator drivers 178, 180, 182 and 184. Each driver may be of conventional design and includes squaring circuitry as is common in the art. The four drivers 178, 180, 182 and 184 output LO1, LO2, LO4 and LO5 which are used to drive the Gilbert cells 102, 104, 108 and 109 of FIG. 5 respectively.

The AGC 96 in the third channel draws differential gain controlled current from an RF amplifier 106 consisting in the illustrative embodiment of two DC biased transistors 105 and 107 arranged in a cascode configuration.

The differential outputs of the Gilbert cells 102, 104, 108 and 109 and the RF amplifier 106 draw current from the source $V_{cc}$ via an associated load resistor $R_L$ for the transconductance amplifier 120. Differential outputs for each channel are provided at the connection with the associated load resistor $R_L$. The Gilbert cells mix the local oscillator signal and the RF signal from the AGC circuits to provide differential outputs for each channel at the local oscillator frequency plus or minus the radio frequency: LO+RF and LO−RF.

Returning to FIG. 1, as discussed above, the mixing circuit 20 provides a 1:N multiplexing of the output of the filter 18 to one of several channels in response to a local oscillator 40 and signals from the controller 30. That is, the output of the mixer 20 is distributed to one of N channels (where N=5 in the illustrative embodiment of FIG. 1). In each channel, a filter 45, 46, 47, 48 or 49 is disposed. The filters 45, 46, 47, 48 and 49 are intermediate frequency (IF) filters which pass signals over various bandwidths at various frequencies as required for a given multi-band application.

The outputs of the filters are combined by an N:1 demultiplexer 50 and input to an intermediate frequency (IF) amplifier 52. The output of the IF amplifier 52 is processed by an anti-aliasing filter 54 and digitized by an analog-to-digital converter (ADC) 56. The output of the ADC is input to a signal processor 58 which outputs to a personal computer (PC) 60 or other output device as may be appropriate for a given application. The signal processor 58 provides control signals for the system 10 via the digital controller 30. That is, in accordance with the present teachings, the signal processor 58 provides channel select, AGC select and local oscillator select control signals for the system 10 via the digital controller 30. The signal processor can do fast Fourier transforms on the received signal, correlate a spread spectrum PN-code, demodulate the received signal, determine chirp rates of received signals, etc. The signal processor is application specific, to perform the necessary processing for a given application. The PC 60 allows for selective display of the information output by the signal processor 58 and/or additional data processing.

The system 10 may be implemented on a single application specific integrated circuit (ASIC). Those skilled in the art will appreciate that flexibility is built into the ASIC, through the multiplexing function, providing the ability to use off-chip inductive-capacitive (LC) or surface acoustic wave (SAW) filters, or on-chip active filters.

In addition, the system may be implemented with a by-pass mode, by which the received signal is not mixed to an IF frequency, but passes instead directly through on-chip (to IF circuitry prior) to an external ADC. The added multiplexing capability of the AGC/low voltage Gilbert mixer allows this flexibility without compromising performance. A key to this performance feature is due to the fact that multiplexing is accomplished in current mode in the RF signal path on-chip.

Since the MUX is integrated in current mode in the RF path, additional measures can be taken to help the isolation. In the case of this architecture, the local oscillator, for the unused channels is blanked so that RF leakage will not mix into the IF bandwidth of interest.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A signal processing system comprising:
    means for receiving an incoming radio frequency signal;
    means for narrowing the received incoming signal to a limited frequency band;
    means for amplifying the narrowed incoming signal;
    means for rejecting an image of the narrowed incoming signal to output an input signal;
    means for distributing the input signal to one of two or more channels;
    means disposed in each of said channels for processing the distributed signal and providing an output signal in response thereto, wherein only one of said processing means is active at a time; and
    means for combining the signals output by two or more said processing means,
    wherein said distribution means further includes means for providing automatic gain control for each of said channels.

2. The invention of claim 1 wherein said means for providing automatic gain control operates in a current mode.

3. The invention of claim 1 wherein said means for providing automatic gain control includes a digital automatic gain control circuit.

4. A signal processing system comprising:
    means for receiving an incoming radio frequency signal;
    means for narrowing the received incoming signal to a limited frequency band;
    means for amplifying the narrowed incoming signal;
    means for rejecting an image of the narrowed incoming signal to output an input signal;
    means for distributing the input signal to one of two or more channels;
    means disposed in each of said channels for processing the distributed signal and providing an output signal in response thereto, wherein only one of said processing means is active at a time; and
    means for combining the signals output by two or more said processing means,
    wherein said distribution means includes a mixing circuit, and
    wherein said mixing circuit further includes means for selectively providing differential digital automatic gain control signals in response to a channel select signal.

5. A signal processing system comprising:
    means for receiving an incoming radio frequency signal;
    means for narrowing the received incoming signal to a limited frequency band;
    means for amplifying the narrowed incoming signal;

means for rejecting an image of the narrowed incoming signal to output an input signal;

means for distributing the input signal to one of two or more channels;

means disposed in each of said channels for processing the distributed signal and providing an output signal in response thereto, wherein only one of said processing means is active at a time; and means for combining the signals output by two or more said processing means, wherein said distribution means includes a mixing circuit, and wherein said mixing circuit includes at least one Gilbert cell.

6. A signal processing system comprising:

means for receiving an incoming radio frequency signal;

means for narrowing the received incoming signal to a limited frequency band;

means for amplifying the narrowed incoming signal;

means for rejecting an image of the narrowed incoming signal to output an input signal;

means for distributing the input signal to one of two or more channels;

means disposed in each of said channels for processing the distributed signal and providing an output signal in response thereto, wherein only one of said processing means is active at a time; and means for combining the signals output by two or more said processing means, wherein said distribution means includes a mixing circuit, and wherein said mixing circuit includes a transconductance amplifier.

7. The invention of claim 6 wherein said mixing circuit includes an automatic gain control circuit.

8. A receiver comprising:

a radio frequency stage for downconverting a received signal and providing said input signal in response thereto;

a distributor for distributing said input signal to one of two or more channels, said distributor including a mixing circuit having:

a Gilbert cell for each channel, an automatic gain control circuit for each channel in communication with a respective one of said Gilbert cells, and a transconductance amplifier in communication with said automatic gain control circuits;

a filter disposed in each of said channel for processing said distributed signals and outputting the processed signals; and a combining circuit for combining the signals output by said processing means.

9. A signal processing circuit comprising:

a receiver for receiving an incoming signal;

a pre select filter connected to the receiver for filtering the received incoming signal;

a low noise amplifier connected to the pre select filter for amplifying the filtered incoming signal;

an image rejection filter connected to the low noise amplifier for rejecting predetermined images of the amplified incoming signal to thereby output an incoming signal;

a distributor connected to the image rejection filter for distributing the input signal to one of at least two channels in a current mode of operation, wherein each of said at least two channels include a Gilbert cell;

an intermediate-frequency filter disposed in each of said two channels for processing said input signal and providing an output signal in response thereto, wherein only one of said intermediate-frequency filters is active at a time; and a multiplexer connected to the outputs of each intermediate-frequency filter for combining the signals output by each of said intermediate-frequency filter.

10. A receiver comprising:

a radio frequency stage for downconverting a received signal and providing said input signal in response thereto;

a distributor for distributing said input signal to one of at least two channels in a current mode of operation, said distributor including a mixing circuit having:

a Gilbert cell for each channel, an automatic gain control circuit for each channel operatively coupled with a respective one of said Gilbert cells, and a transconductance amplifier operatively coupled with said automatic gain control circuits; and a filters disposed in each of said channels for processing said input signal and providing an output signal in response thereto.

* * * * *